(12) United States Patent
Chow et al.

(10) Patent No.: US 8,604,602 B2
(45) Date of Patent: Dec. 10, 2013

(54) INTEGRATED CIRCUIT PACKAGING SYSTEM WITH REINFORCED ENCAPSULANT HAVING EMBEDDED INTERCONNECT AND METHOD OF MANUFACTURE THEREOF

(75) Inventors: Seng Guan Chow, Singapore (SG); Il Kwon Shim, Singapore (SG); Heap Hoe Kuan, Singapore (SG); Youngcheol Kim, Youngin-si (KR)

(73) Assignee: Stats Chippac Ltd., Singapore (SG)

( * ) Notice: Subject to any disclaimer, the term of this patent is extended or adjusted under 35 U.S.C. 154(b) by 326 days.

(21) Appl. No.: 12/777,415

(22) Filed: May 11, 2010

(65) Prior Publication Data

US 2010/0289134 A1  Nov. 18, 2010

Related U.S. Application Data

(60) Provisional application No. 61/178,838, filed on May 15, 2009.

(51) Int. Cl.
- *H01L 23/48* (2006.01)
- *H01L 23/52* (2006.01)
- *H01L 21/00* (2006.01)

(52) U.S. Cl.
USPC ............... 257/692; 438/118; 438/125

(58) Field of Classification Search
USPC ............. 257/692; 438/118, 125–127
See application file for complete search history.

(56) References Cited

U.S. PATENT DOCUMENTS

| | | | | |
|---|---|---|---|---|
| 5,438,216 | A * | 8/1995 | Juskey et al. | 257/434 |
| 5,835,355 | A * | 11/1998 | Dordi | 361/760 |
| 7,183,191 | B2 * | 2/2007 | Kinsman et al. | 438/613 |
| 7,253,078 | B1 * | 8/2007 | Nguyen et al. | 438/411 |
| 7,354,800 | B2 * | 4/2008 | Carson | 438/109 |
| 7,417,322 | B2 * | 8/2008 | Kang | 257/777 |
| 7,550,832 | B2 * | 6/2009 | Weng et al. | 257/685 |
| 7,732,252 | B2 * | 6/2010 | Chow et al. | 438/107 |
| 2003/0064547 | A1 * | 4/2003 | Akram et al. | 438/108 |
| 2004/0150099 | A1 * | 8/2004 | Ding et al. | 257/712 |
| 2004/0152235 | A1 * | 8/2004 | Lee | 438/106 |
| 2004/0183179 | A1 * | 9/2004 | Shieh et al. | 257/686 |
| 2005/0260795 | A1 * | 11/2005 | Park et al. | 438/111 |
| 2007/0190690 | A1 | 8/2007 | Chow et al. | |
| 2007/0241441 | A1 * | 10/2007 | Choi et al. | 257/686 |
| 2009/0108431 | A1 | 4/2009 | Farley | |
| 2009/0223048 | A1 | 9/2009 | Pendse | |
| 2009/0236726 | A1 * | 9/2009 | Retuta et al. | 257/690 |
| 2010/0038781 | A1 | 2/2010 | Park et al. | |

* cited by examiner

*Primary Examiner* — Fernando L Toledo
*Assistant Examiner* — Karen Kusumakar
(74) *Attorney, Agent, or Firm* — Ishimaru & Associates LLP

(57) ABSTRACT

A method of manufacture of an integrated circuit packaging system includes: fabricating a base package substrate having a component side and a system side; coupling stacking interconnects on the component side; and forming an integrated circuit receptacle, for receiving an integrated circuit device, by molding a reinforced encapsulant on the component side and exposing a portion of the stacking interconnects.

20 Claims, 7 Drawing Sheets

INTEGRATED CIRCUIT PACKAGING SYSTEM WITH REINFORCED ENCAPSULANT HAVING EMBEDDED INTERCONNECT AND METHOD OF MANUFACTURE THEREOF

CROSS-REFERENCE TO RELATED APPLICATION

This application claims the benefit of U.S. Provisional Patent Application Ser. No. 61/178,838 filed May 15, 2009, and the subject matter thereof is incorporated herein by reference thereto.

TECHNICAL FIELD

The present invention relates generally to an integrated circuit packaging system, and more particularly to a system having encapsulant embedded interconnects.

BACKGROUND ART

Integrated circuit packaging technology has seen an increase in the number of integrated circuits mounted on a single circuit board or substrate. The new packaging designs are more compact in form factors, such as the physical size and shape of an integrated circuit, and providing a significant increase in overall integrated circuit density. However, integrated circuit density continues to be limited by the "real estate" available for mounting individual integrated circuits on a substrate. Even larger form factor systems, such as personal computers, compute servers, and storage servers, need more integrated circuits in the same or smaller "real estate". Particularly acute, the needs for portable personal electronics, such as cell phones, digital cameras, music players, personal digital assistants, and location-based devices, have further driven the need for integrated circuit density.

This increased integrated circuit density, has led to the development of multi-chip packages in which more than one integrated circuit can be packaged. Each package provides mechanical support for the individual integrated circuits and one or more layers of interconnect lines that enable the integrated circuits to be connected electrically to surrounding circuitry. Current multi-chip packages, also commonly referred to as multi-chip modules, typically consist of a printed circuit board substrate onto which a set of separate integrated circuit components are attached. Such multi-chip packages have been found to increase integrated circuit density and miniaturization, improve signal propagation speed, reduce overall integrated circuit size and weight, improve performance, and lower costs—all primary goals of the computer industry.

Multi-chip packages whether vertically or horizontally arranged, can also present problems because they usually must be pre-assembled before the integrated circuit and integrated circuit connections can be tested. Thus, when integrated circuits are mounted and connected in a multi-chip module, the individual integrated circuits and connections cannot be tested individually, and it is not possible to identify known-good-die ("KGD") before being assembled into larger circuits. Consequently, conventional multi-chip packages lead to assembly process yield problems. This fabrication process, which does not identify KGD, is therefore less reliable and more prone to assembly defects.

Moreover, vertically stacked integrated circuits in typical multi-chip packages can present problems beyond those of horizontally arranged integrated circuit packages, further complicating the manufacturing process. It is more difficult to test and thus determine the actual failure mode of the individual integrated circuits. The substrate and integrated circuit are often damaged during assembly or testing, complicating the manufacturing process and increasing costs. The vertically stacked integrated circuit problems can be greater than the benefits.

In addition, multi-chip packages generally provide higher density of integrated circuits but present yet other challenges. Additional structures, such as printed circuit boards, interposers, or flexible wiring, must be currently used to connect the integrated circuits in the multi-chip package. Current embedded die packages create vias inside the package using processes such as etching, laser drilling, via plating, filling, etc. These processes are expensive and involved more process steps. This, in turn, increases the manufacturing cost of making such packages.

These additional structures add cost, manufacturing complexity, potential failure areas, and potential reliability problems. A primary concern is the warping of package components that can cause manufacturing failures due to faulty connections. The warping can also cause finished packages to not meet coplanarity specifications required for reliable assembly at the next system level. In many cases the warped packages can not be reworked or repaired, which adds scrap expense to the manufacturing process.

Thus, a need still remains for an integrated circuit packaging system that can improve the yield of stacked packages by maintaining the planarity of the bottom package. In view of the demand for increased integrated circuit density in shrinking spaces, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: fabricating a base package substrate having a component side and a system side; coupling stacking interconnects on the component side; and forming an integrated circuit receptacle, for receiving an integrated circuit device, by molding a reinforced encapsulant on the component side and exposing a portion of the stacking interconnects.

The present invention provides an integrated circuit packaging system including: a base package substrate having a component side and a system side; stacking interconnects on the component side; and an integrated circuit receptacle, for receiving an integrated circuit device, formed by a reinforced encapsulant molded on the component side with a portion of the stacking interconnects exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
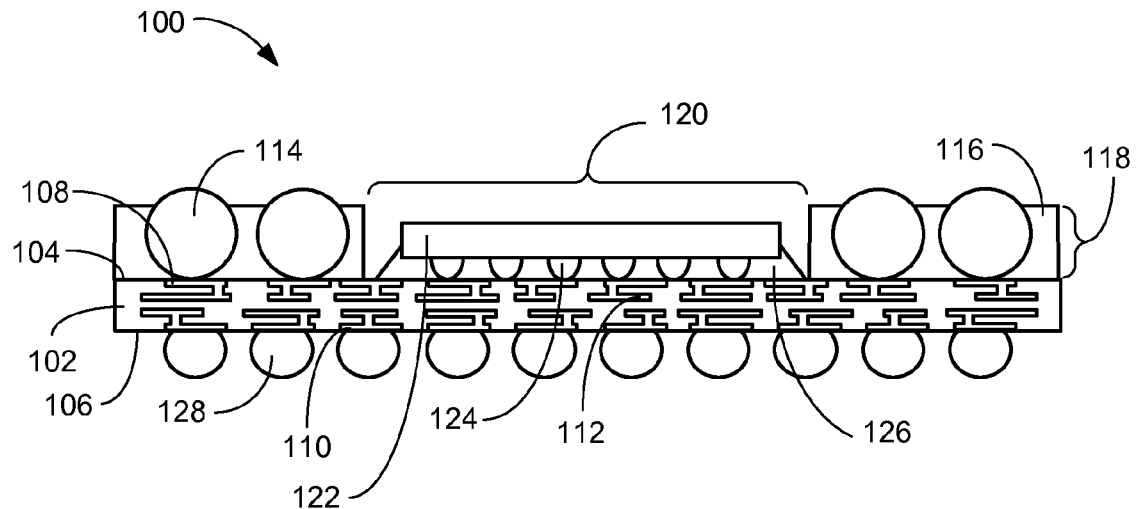
FIG. 1 is a cross-sectional view of an integrated circuit packaging system with reinforced encapsulant having embedded interconnects, in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the base package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements without having any intervening material.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit packaging system 100 with reinforced encapsulant having embedded interconnects, in a first embodiment of the present invention. The cross-sectional view of the integrated circuit packaging system 100 depicts a base package substrate 102, such as a laminate substrate, a ceramic substrate, or the like, having a component side 104 and a system side 106.

Component pads 108 may be formed on the component side 104. The component pads 108 may be coupled to system pads 110 by internal circuitry 112, such as vias, traces, or a combination thereof.

Stacking interconnects 114, such as metal balls, metal columns, stud bumps, or metal bumps, may be coupled to the component pads 108 around the peripheral region of the base package substrate 102. A reinforced encapsulant 116, such as an epoxy molding compound, may be formed on the stacking interconnects 114 leaving a portion of the stacking interconnects 114 exposed from the reinforced encapsulant 116.

It has been discovered that an encapsulant thickness 118 of the reinforced encapsulant 116 should range from 30% to 90% of the total height of the stacking interconnects 114 and preferably should be 40% to 70% of the total height of the stacking interconnects 114. The reason for the encapsulant thickness 118 of the reinforced encapsulant 116 has been the discovery that stacked packages on substrates having the stacking interconnects 114 on the component side 104 of the base package substrate 102 present a technical problem due to warpage of the base package substrates 102. It has been discovered that the above-specified thickness of the reinforced encapsulant 116 can provide added rigidity to the base package substrate 102 and eliminate package level warpage and thus solve the package level stacking issue.

The reinforced encapsulant 116 may be formed around an integrated circuit receptacle 120, such as a central recessed region capable of receiving and mounting an integrated circuit device 122 on the component side 104. The integrated circuit device 122 can be inserted into the integrated circuit receptacle 120 for mounting on the component side 104. The integrated circuit receptacle 120 has the component side 104 exposed with the component pads 108 available, within the integrated circuit receptacle 120, for coupling the integrated circuit device 122, such as an integrated circuit die.

It has been discovered that the integrated circuit receptacle 120 may allow removal and replacement of the integrated circuit device 122 should it be detected as inoperative during the manufacturing process. This aspect may significantly reduce the manufacturing cost of the integrated circuit packaging system 100 by reducing the amount of scrap material disposed due to failure of the integrated circuit device 122.

The integrated circuit device 122, such as a wire bond type, a flip chip type of the integrated circuit die, or a stacked combination thereof, may be coupled to the component pads 108 exposed in the integrated circuit receptacle 120 by chip interconnects 124 after the reinforced encapsulant 116 has been cured. An adhesive 126 may be applied between the component side 104 and the integrated circuit device 122. The sidewalls of the reinforced encapsulant 116 must be formed to allow sufficient space around the integrated circuit device 122 to allow application of the adhesive 126.

System interconnects 128 are formed on the system pads 110 located on the system side 106 of the base package substrate 102. The system interconnects 128 may provide a coupling path between the stacking interconnects 114, the integrated circuit device 122, the next level system (not shown), or a combination thereof.

Figure 2:
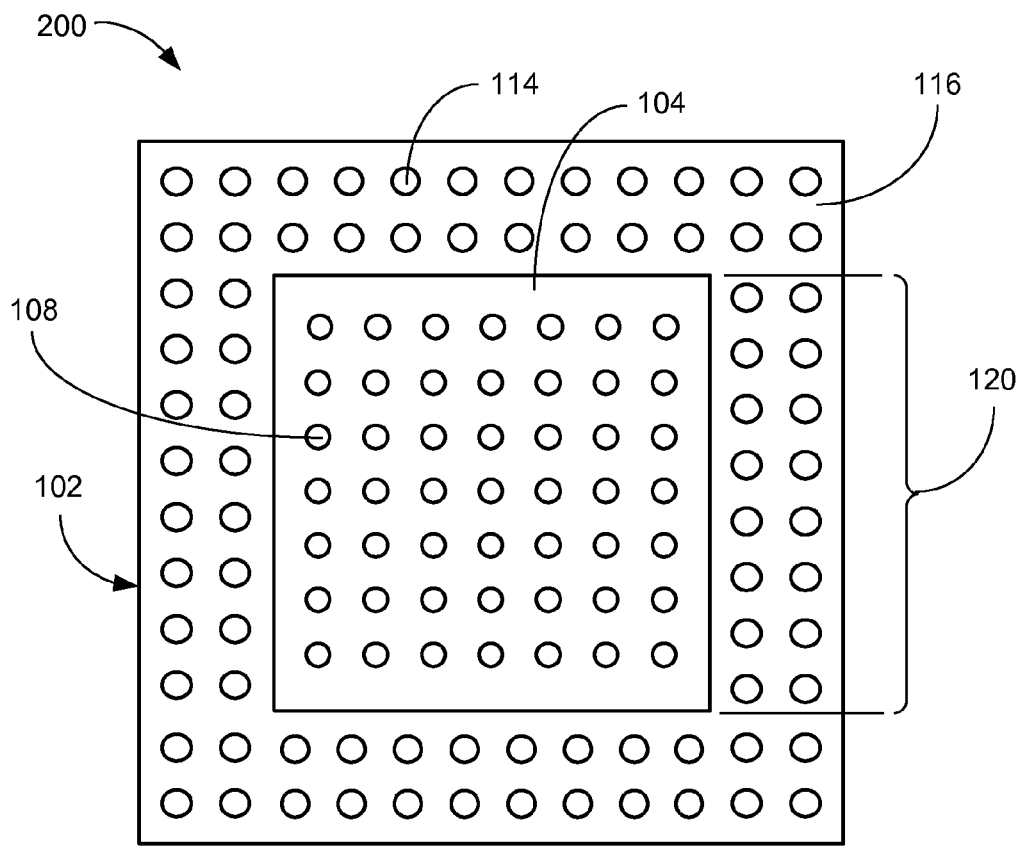
FIG. 2 is a top view of a substrate assembly with reinforced encapsulation in an embodiment of the present invention.

Referring now to FIG. 2, therein is shown a top view of a substrate assembly 200 with reinforced encapsulation in an embodiment of the present invention. The top view of the substrate assembly 200 depicts the reinforced encapsulant 116 formed in the peripheral region of the base package substrate 102.

The stacking interconnects 114 may be arranged in adjacent rows within the reinforced encapsulant 116. The number and position of the stacking interconnects 114 is an example only and a different number may be implemented.

The reinforced encapsulant 116 also forms a perimeter wall around the integrated circuit receptacle 120. The component pads 108 may be arranged in an array suitable for mounting a flip chip type of the integrated circuit device 122, a wire bond type of the integrated circuit device 122, or a combination of both in a stacked configuration.

It is understood that the number and position of the component pads 108 on the component side 104 of the base package substrate 102 is an example only and the actual number and position may vary. The shape of the component pads 108 is also an example and the component pads 108 may actually be rectangular or some other geometric shape. In order to accommodate a stack of the integrated circuit dies 122 the component pads 108 may have multiple shapes and spacing.

Figure 3:
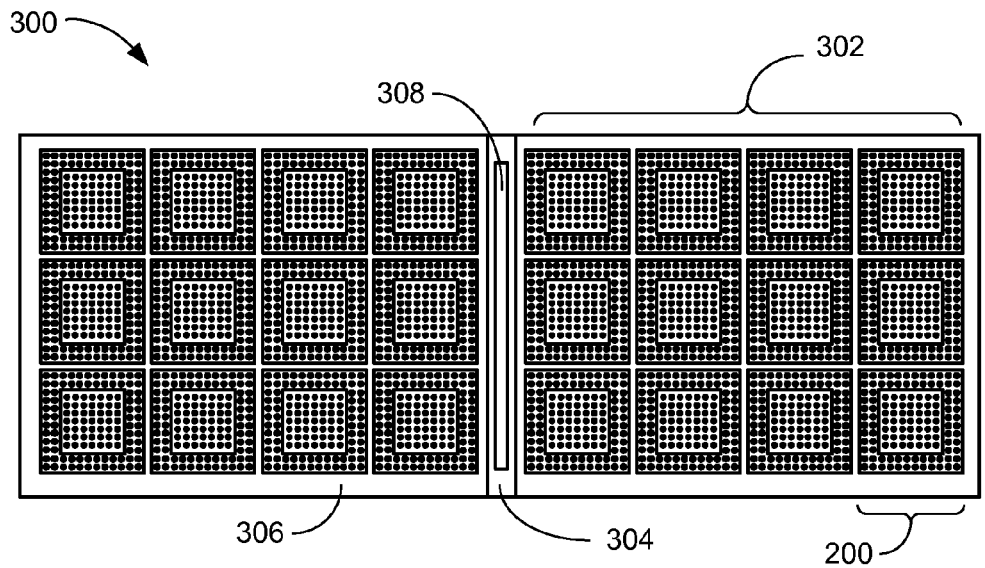
FIG. 3 is a top view of a fabrication panel assembly for the substrate assembly of FIG. 2.

Referring now to FIG. 3, therein is shown a top view of a fabrication panel assembly 300 for the substrate assembly 200, of FIG. 2. The top view of the fabrication panel assembly 300 depicts an array 302 of instances of the substrate assembly 200.

A circuit board 304, such as a laminate circuit board, may support more than one of the array 302. A covering 306, such as a solder mask, may be formed on the top side of the circuit board 304.

The number of the instances of the substrate assembly 200 in the fabrication panel assembly 300 is an example only and a different number and orientation may be used. A handling slot 308 may be used for manipulating the circuit board 304 during the assembly and fabrication processes.

Figure 4:
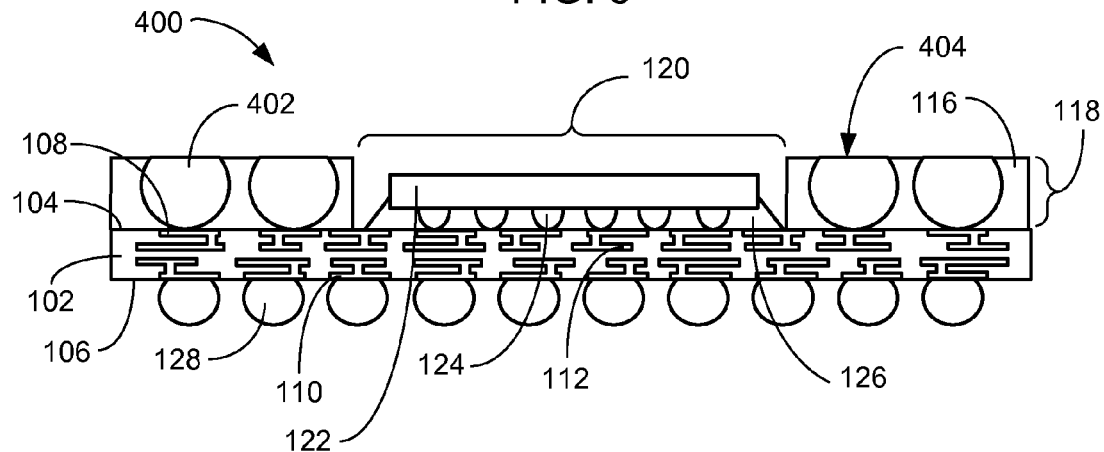
FIG. 4 is a cross-sectional view of an integrated circuit packaging system with reinforced encapsulation having embedded interconnects, in a second embodiment of the present invention.

Referring now to FIG. 4, therein is shown a cross-sectional view of an integrated circuit packaging system 400 with reinforced encapsulation having embedded interconnects, in a second embodiment of the present invention. The cross-sectional view of the integrated circuit packaging system 400 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

Stacking interconnects 402, such as metal balls, metal columns, stud bumps, or metal bumps, may be coupled to the component pads 108 around the peripheral region of the base package substrate 102. The reinforced encapsulant 116, such as an epoxy molding compound, may be formed on the stacking interconnects 114 leaving a portion of the stacking interconnects 114 exposed from the reinforced encapsulant 116.

It has been discovered that the encapsulant thickness 118 of the reinforced encapsulant 116 should range from 30% to 90% of the total height of the stacking interconnects 114 and preferably should be 40% to 70% of the total height of the stacking interconnects 114. The reason for the encapsulant thickness 118 of the reinforced encapsulant 116 has been the discovery that stacked packages on substrates having the stacking interconnects 114 on the component side 104 of the base package substrate 102 present a technical problem due to warpage of the base package substrates 102. It has been discovered that the above-specified thickness of the reinforced encapsulant 116 can provide added rigidity to the base package substrate 102 and eliminate package level warpage and thus solve the package level stacking issue.

The stacking interconnects 402 may have been coined, hammered, compressed, or shaved in order to form a substantially coplanar surface 404 with the top of the reinforced encapsulant 116. The substantially coplanar surface 404 may provide a more secure mounting surface for a stacked integrated circuit package (not shown).

The reinforced encapsulant 116 may be formed around the integrated circuit receptacle 120, such as a central recessed region capable of receiving and mounting the integrated circuit device 122 on the component side 104. The integrated circuit receptacle 120 has the component side 104 exposed with the component pads 108 available, within the integrated circuit receptacle 120, for coupling the integrated circuit device 122. The integrated circuit device 122, such as a wire bond type, a flip chip type of integrated circuit die, or a stacked combination thereof, may be coupled to the component pads 108 exposed in the integrated circuit receptacle 120 by the chip interconnects 124 after the reinforced encapsulant 116 has been cured.

The adhesive 126 may be applied between the component side 104 and the integrated circuit device 122. The sidewalls of the reinforced encapsulant 116 must be formed to allow sufficient space around the integrated circuit device 122 to allow application of the adhesive 126.

The system interconnects 128 are formed on the system pads 110 located on the system side 106 of the base package substrate 102. The system interconnects 128 may provide the coupling path between the stacking interconnects 402, the integrated circuit device 122, the next level system (not shown), or a combination thereof.

Figure 5:
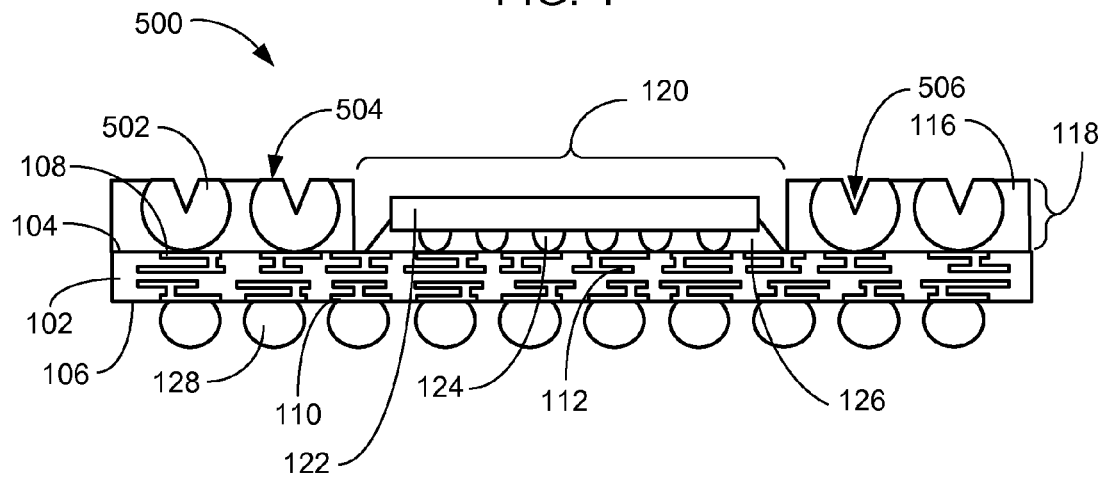
FIG. 5 is a cross-sectional view of an integrated circuit packaging system with reinforced encapsulation having embedded interconnects, in a third embodiment of the present invention.

Referring now to FIG. 5, therein is shown a cross-sectional view of an integrated circuit packaging system 500 with reinforced encapsulation having embedded interconnects, in a third embodiment of the present invention. The cross-sectional view of the integrated circuit packaging system 500 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

Stacking interconnects 502, such as metal balls, metal columns, stud bumps, or metal bumps, may be coupled to the component pads 108 around the peripheral region of the base package substrate 102. The reinforced encapsulant 116, such as an epoxy molding compound, may be formed on the stacking interconnects 114 leaving a portion of the stacking interconnects 114 exposed from the reinforced encapsulant 116.

It has been discovered that the encapsulant thickness 118 of the reinforced encapsulant 116 should range from 30% to 90% of the total height of the stacking interconnects 114 and preferably should be 40% to 70% of the total height of the stacking interconnects 114. The reason for the encapsulant thickness 118 of the reinforced encapsulant 116 has been the discovery that stacked packages on substrates having the stacking interconnects 114 on the component side 104 of the base package substrate 102 present a technical problem due to warpage of the base package substrates 102. It has been discovered that the above-specified thickness of the reinforced encapsulant 116 can provide added rigidity to the base package substrate 102 and eliminate package level warpage and thus solve the package level stacking issue.

The stacking interconnects 502 may have been coined, hammered, compressed, or shaved in order to form a substantially coplanar surface 504 with the top of the reinforced encapsulant 116. The substantially coplanar surface 504 may provide a more secure mounting surface for a stacked integrated circuit package (not shown).

It has been discovered that, when the stacking interconnect 502 is coplanar with the top of the reinforced encapsulant 116, it is often difficult to align the system interconnects 128 of a package above to the exposed portion of the stacking interconnects 502. It has also been discovered that the stacking interconnect 502 can be indented or notched on top either before or after encapsulation to provide an alignment receptacle 506 for positioning the system interconnects 128 to solve this alignment problem.

The reinforced encapsulant 116 may be formed around the integrated circuit receptacle 120, such as a central recessed region capable of receiving and mounting the integrated circuit device 122 on the component side 104. The integrated circuit receptacle 120 has the component side 104 exposed with the component pads 108 available, within the integrated circuit receptacle 120, for coupling the integrated circuit device 122. The integrated circuit device 122, such as a wire bond type, a flip chip type of integrated circuit die, or a stacked combination thereof, may be coupled to the component pads 108 exposed in the integrated circuit receptacle 120 by the chip interconnects 124 after the reinforced encapsulant 116 has been cured.

The adhesive 126 may be applied between the component side 104 and the integrated circuit device 122. The sidewalls of the reinforced encapsulant 116 must be formed to allow sufficient space around the integrated circuit device 122 to allow application of the adhesive 126.

The system interconnects 128 are formed on the system pads 110 located on the system side 106 of the base package substrate 102. The system interconnects 128 may provide the coupling path between the stacking interconnects 502, the integrated circuit device 122, the next level system (not shown), or a combination thereof.

Figure 6:
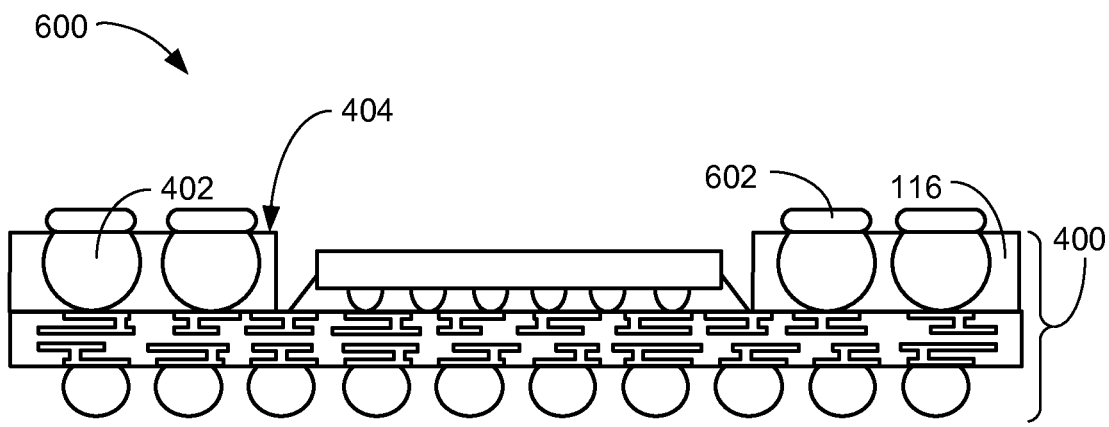
FIG. 6 is a cross-sectional view of an integrated circuit packaging system with reinforced encapsulation having embedded interconnects, in a fourth embodiment of the present invention.

Referring now to FIG. 6, therein is shown a cross-sectional view of an integrated circuit packaging system 600 with reinforced encapsulation having embedded interconnects, in a fourth embodiment of the present invention. The cross-sectional view of the integrated circuit packaging system 600 depicts the integrated circuit packaging system 400 having a conductive adhesive 602, such as a solder paste, applied on the stacking interconnects 402 of the substantially coplanar surface 404.

It has been discovered that, when the stacking interconnects 402 are coplanar with the top of the reinforced encapsulant 116, it is often difficult to attach a stacked package (not shown) to the exposed portion of the stacking interconnect 402. It has been discovered that the reinforced encapsulant 116 can be used as a solder resist to allow the conductive adhesive 602 to be deposited on the stacking interconnects 402 by screen print and solder reflow to solve this package stacking problem and improve solder joint reliability.

Figure 7:
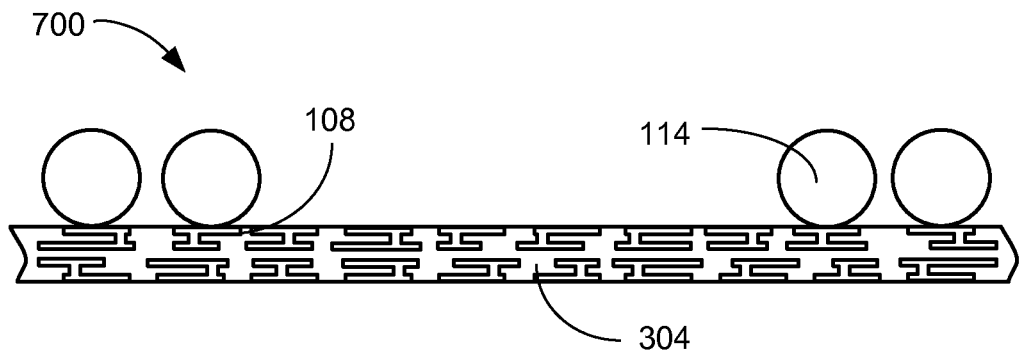
FIG. 7 is a cross-sectional view of a substrate assembly in a stacking interconnect mounting phase of manufacturing.

Referring now to FIG. 7, therein is shown a cross-sectional view of a substrate assembly 700 in a stacking interconnect mounting phase of manufacturing. The cross-sectional view of the substrate assembly 700 depicts a segment of the circuit board 304 of the fabrication panel assembly 300, of FIG. 3.

The stacking interconnects 114 may be formed on the component pads 108. The position and number of the stacking interconnects 114 is an example only and any number of the stacking interconnects 114 may be formed on the circuit board 304. While the stacking interconnects 114 are shown as balls, it is understood that this is an example only and they may also be implemented as columns, posts or bumps.

Figure 8:
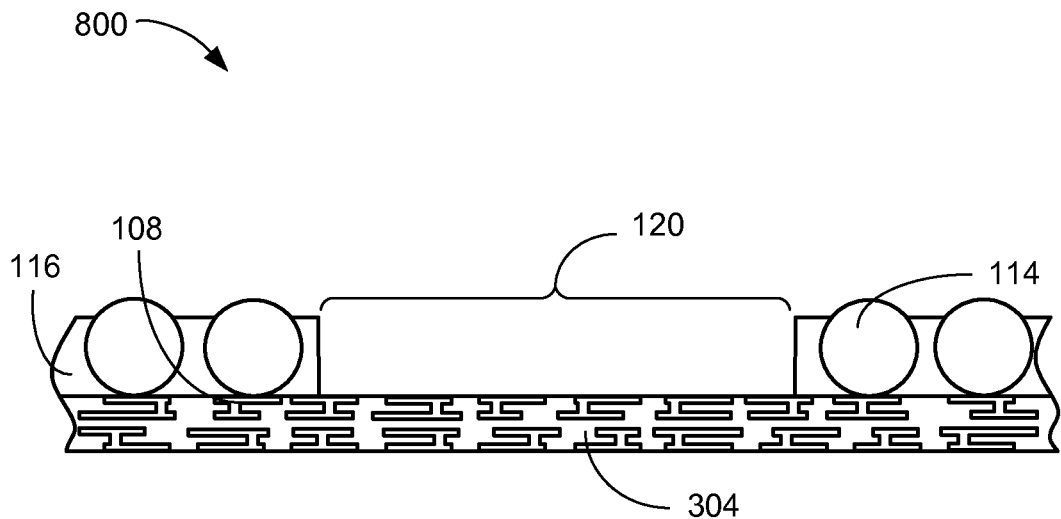
FIG. 8 is a cross-sectional view of a substrate assembly in a substrate molding phase of manufacturing.

Referring now to FIG. 8, therein is shown a cross-sectional view of a segment of a substrate assembly 800 in a substrate molding phase of manufacturing. The cross-sectional view of a segment of the substrate assembly 800 depicts the segment of the circuit board 304 of the fabrication panel assembly 300, of FIG. 3.

The stacking interconnects 114 may be formed on the component pads 108. The position and number of the stacking interconnects 114 is an example only and any number of the stacking interconnects 114 may be formed on the circuit board 304.

The reinforced encapsulant 116 may be molded on the stacking interconnects 114 to include forming the integrated circuit receptacle 120. After the curing of the reinforced encapsulant 116, the stacking interconnects 114 may be further processed by coining, shaving, notching, or a combination thereof.

Figure 9:
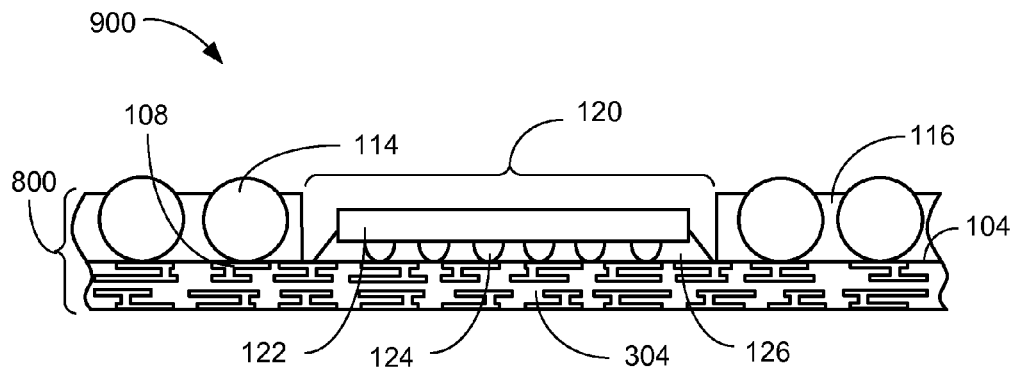
FIG. 9 is a cross-sectional view of a segment of a substrate assembly in an integrated circuit mounting phase of manufacturing.

Referring now to FIG. 9, therein is shown a cross-sectional view of a segment of a substrate assembly 900 in an integrated circuit mounting phase of manufacturing. The cross-sectional view of the substrate assembly 900 depicts the substrate assembly 800 having the integrated circuit device 122 coupled to the component pads 108 by the chip interconnects 124.

The adhesive 126 may be applied between the component side 104 and the integrated circuit device 122. The integrated circuit device 122 is shown as a flip chip die as an example only and the integrated circuit device 122 may also be a wire bond type of integrated circuit die or a stack of a combination of different types of the integrated circuit device 122.

Figure 10:
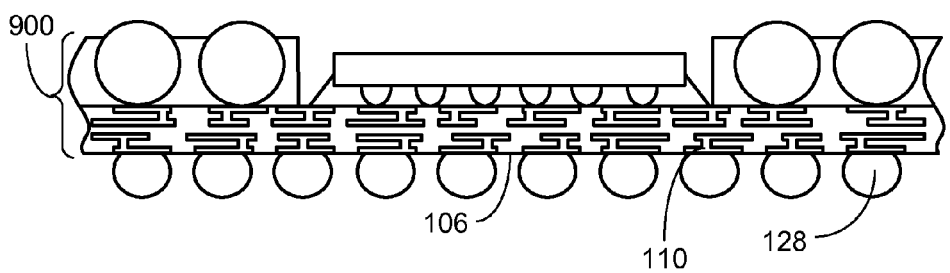
FIG. 10 is a cross-sectional view of a segment of an integrated circuit packaging assembly in a pre-singulation phase of manufacturing.

Referring now to FIG. 10, therein is shown a cross-sectional view of a segment of an integrated circuit packaging assembly 1000 in a pre-singulation phase of manufacturing. The cross-sectional view of the segment of the integrated circuit packaging assembly 1000 depicts the substrate assembly 900 having the system interconnects 128 formed on the system pads 110 of the system side 106.

The segment of the integrated circuit packaging assembly 1000 may be completely assembled while being a part of the fabrication panel assembly 300, of FIG. 3. The subsequent phase of manufacturing may provide a test and singulation of the integrated circuit packaging system 100, of FIG. 1.

Figure 11:
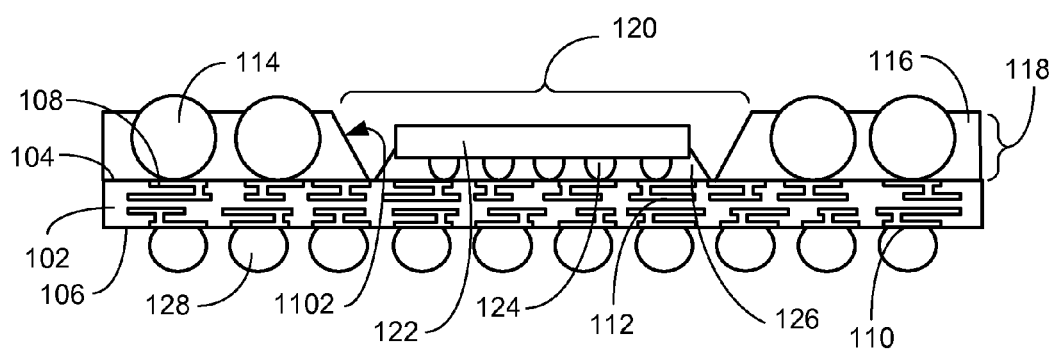
FIG. 11 is a cross-sectional view of an integrated circuit packaging system with reinforced encapsulation having embedded interconnects, in a fifth embodiment of the present invention.

Referring now to FIG. 11, therein is shown a cross-sectional view of an integrated circuit packaging system 1100 with reinforced encapsulation having embedded interconnects, in a fifth embodiment of the present invention. The cross-sectional view of the integrated circuit packaging system 1100 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

The stacking interconnects 114, such as metal balls, metal columns, stud bumps, or metal bumps, may be coupled to the component pads 108 around the peripheral region of the base package substrate 102. The reinforced encapsulant 116, such as an epoxy molding compound, may be formed on the stacking interconnects 114 leaving a portion of the stacking interconnects 114 exposed from the reinforced encapsulant 116.

It has been discovered that the encapsulant thickness 118 of the reinforced encapsulant 116 should range from 30% to 90% of the total height of the stacking interconnects 114 and preferably should be 40% to 70% of the total height of the stacking interconnects 114. The reason for the encapsulant thickness 118 of the reinforced encapsulant 116 has been the discovery that stacked packages on substrates having the stacking interconnects 114 on the component side 104 of the base package substrate 102 present a technical problem due to warpage of the base package substrates 102.

It has been discovered that the above-specified thickness of the reinforced encapsulant 116 can provide added rigidity to the base package substrate 102 and eliminate package level warpage and thus solve the package level stacking issue. In the present embodiment, inner walls 1102 of the encapsulant are sloped, which gives sufficient space for the dispensing the adhesive 126 at the integrated circuit receptacle 120, but yet allow the reinforced encapsulant 116 to act as a "dam" to prevent excessive bleed out of the adhesive 126 at the component side 104.

The stacking interconnects 114 may have been coined, hammered, compressed, or shaved in order to form the substantially coplanar surface 404, of FIG. 4, with the top of the reinforced encapsulant 116. The substantially coplanar surface 404 may provide a more secure mounting surface for a stacked integrated circuit package (not shown).

The reinforced encapsulant 116 may be formed around the integrated circuit receptacle 120, such as a central recessed region capable of receiving and mounting the integrated circuit device 122 on the component side 104. The integrated circuit receptacle 120 has the component side 104 exposed with the component pads 108 available, within the integrated circuit receptacle 120, for coupling the integrated circuit device 122. The integrated circuit device 122, such as a wire bond type, a flip chip type of integrated circuit die, or a stacked combination thereof, may be coupled to the component pads 108 exposed in the integrated circuit receptacle 120 by the chip interconnects 124 after the reinforced encapsulant 116 has been cured.

The adhesive 126 may be applied between the component side 104 and the integrated circuit device 122. The sidewalls of the reinforced encapsulant 116 must be formed to allow sufficient space around the integrated circuit device 122 to allow application of the adhesive 126.

The system interconnects 128 are formed on the system pads 110 located on the system side 106 of the base package substrate 102. The system interconnects 128 may provide the coupling path between the stacking interconnects 402, the integrated circuit device 122, the next level system (not shown), or a combination thereof.

Figure 12:
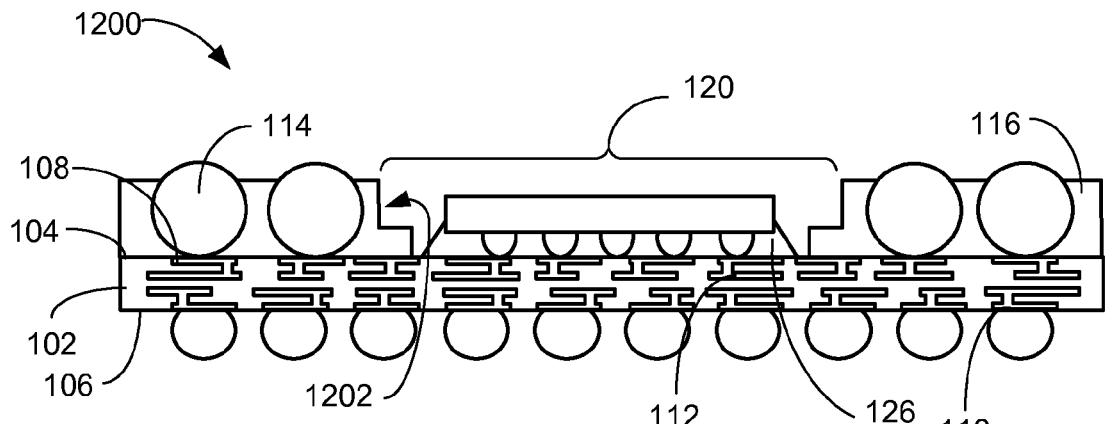
FIG. 12 is a cross-sectional view of an integrated circuit packaging system with reinforced encapsulation having embedded interconnects, in a sixth embodiment of the present invention.

Referring now to FIG. 12, therein is shown a cross-sectional view of an integrated circuit packaging system 1200 with reinforced encapsulation having embedded interconnects, in a sixth embodiment of the present invention. The cross-sectional view of the integrated circuit packaging system 1200 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

The stacking interconnects 114, such as metal balls, metal columns, stud bumps, or metal bumps, may be coupled to the component pads 108 around the peripheral region of the base package substrate 102. The reinforced encapsulant 116, such as an epoxy molding compound, may be formed on the stacking interconnects 114 leaving a portion of the stacking interconnects 114 exposed from the reinforced encapsulant 116.

In the present embodiment, inner walls 1202, of the reinforced encapsulant 116, are stepped. The steps of the inner walls 1202 give sufficient space for the dispensing the adhesive 126 at the integrated circuit receptacle 120, but yet allow the reinforced encapsulant 116 to act as a "dam" to prevent excessive bleed out of the adhesive 126 at the component side 104.

Figure 13:
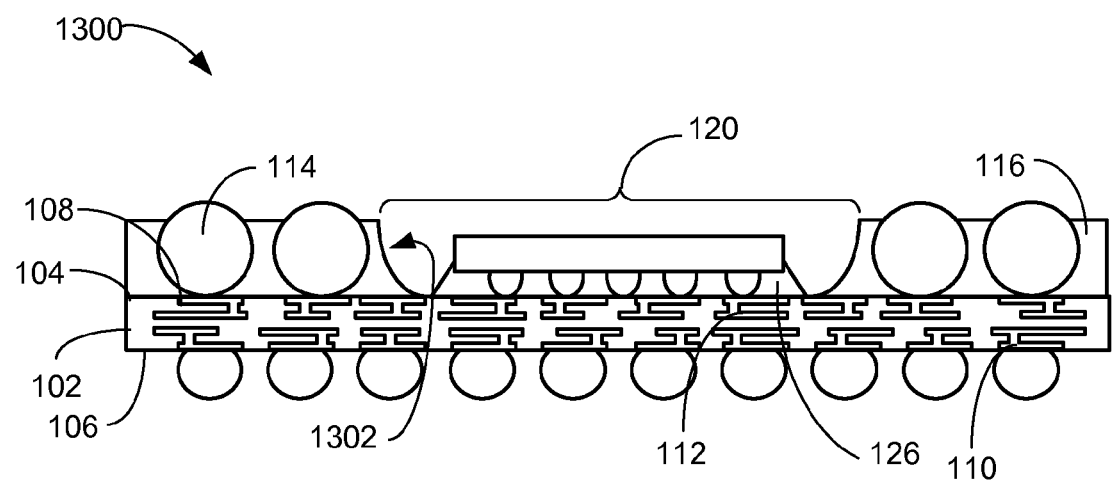
FIG. 13 is a cross-sectional view of an integrated circuit packaging system with reinforced encapsulation having embedded interconnects, in a seventh embodiment of the present invention.

Referring now to FIG. 13, therein is shown a cross-sectional view of an integrated circuit packaging system 1300 with reinforced encapsulation having embedded interconnects, in a seventh embodiment of the present invention. The cross-sectional view of the integrated circuit packaging system 1300 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

The stacking interconnects 114, such as metal balls, metal columns, stud bumps, or metal bumps, may be coupled to the component pads 108 around the peripheral region of the base package substrate 102. The reinforced encapsulant 116, such as an epoxy molding compound, may be formed on the stacking interconnects 114 leaving a portion of the stacking interconnects 114 exposed from the reinforced encapsulant 116.

In the present embodiment, inner walls 1302, of the reinforced encapsulant 116, are curved. The curve of the inner walls 1302 give sufficient space for the dispensing the adhesive 126 at the integrated circuit receptacle 120, but yet allow the reinforced encapsulant 116 to act as a "dam" to prevent excessive bleed out of the adhesive 126 at the component side 104.

Figure 14:
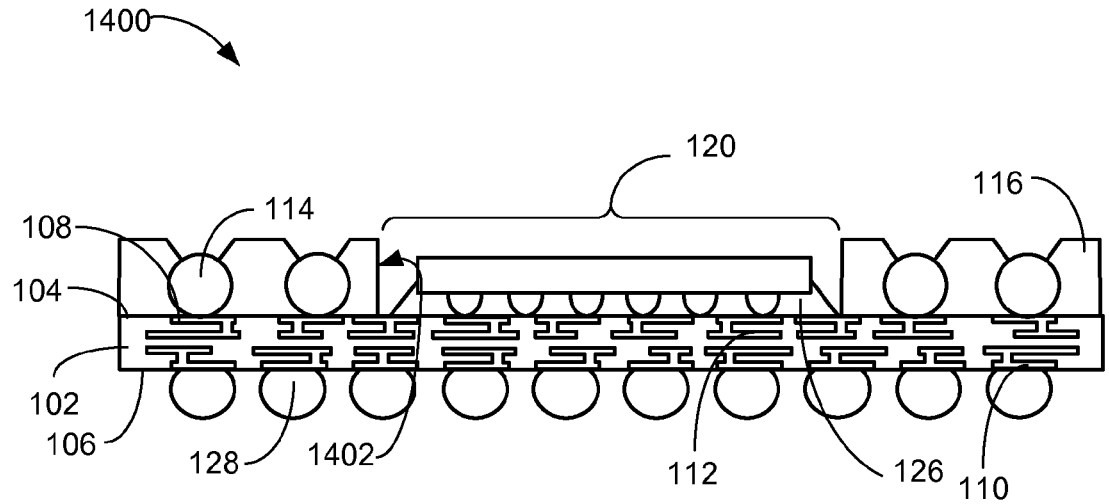
FIG. 14 is a cross-sectional view of an integrated circuit packaging system with reinforced encapsulation having embedded interconnects, in an eighth alternative embodiment of the present invention.

Referring now to FIG. 14, therein is shown a cross-sectional view of an integrated circuit packaging system 1400 with reinforced encapsulation having embedded interconnects, in an eighth alternative embodiment of the present invention. The cross-sectional view of the integrated circuit packaging system 1400 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

The stacking interconnects 114, such as metal balls, metal columns, stud bumps, or metal bumps, may be coupled to the component pads 108 around the peripheral region of the base package substrate 102. The reinforced encapsulant 116, such as an epoxy molding compound, may be formed on the stacking interconnects 114 leaving a portion of the stacking interconnects 114 exposed from the reinforced encapsulant 116.

In the present embodiment, inner walls 1402, of the reinforced encapsulant 116, are substantially vertical. The vertical surface of the inner walls 1402 give sufficient space for the dispensing the adhesive 126 at the integrated circuit receptacle 120, but yet allow the reinforced encapsulant 116 to act as a "dam" to prevent excessive bleed out of the adhesive 126 at the component side 104.

It has been discovered that, when the stacking interconnect 114 extends below the reinforced encapsulant 116, it is sometimes difficult to couple the system interconnects 128 of a package (not shown) above to an exposed portion of the stacking interconnect 114. It has been discovered that the stacking interconnect 114 can be exposed after encapsulation by laser ablation, chemical etching, or mechanical drilling.

Figure 15:
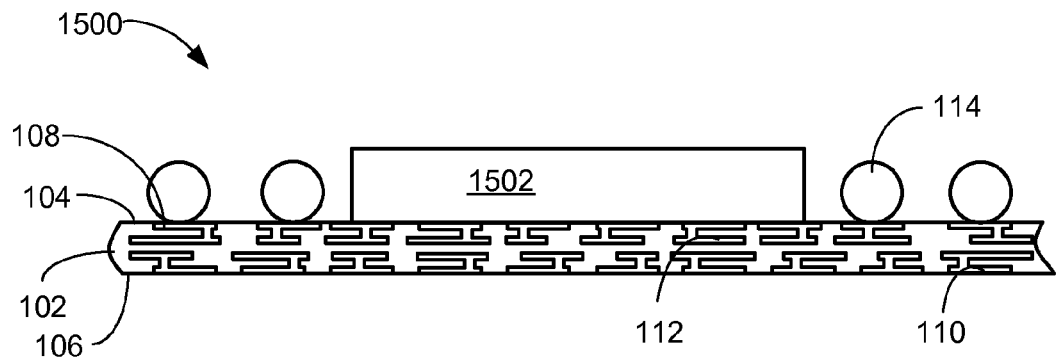
FIG. 15 is shown a cross-sectional view of a base package substrate assembly in an interconnect mounting phase of manufacturing for the eighth alternative embodiment of the present invention.

Referring now to FIG. 15, therein is shown a cross-sectional view of a base package substrate assembly 1500 in an interconnect mounting phase of manufacturing for the eighth alternative embodiment of the present invention. The cross-sectional view of the base package substrate assembly 1500 depicts the base package substrate 102, such as a laminate substrate, a ceramic substrate, or the like, having the component side 104 and the system side 106.

The component pads 108 may be formed on the component side 104. The component pads 108 may be coupled to the system pads 110 by the internal circuitry 112, such as vias, traces, or a combination thereof.

The stacking interconnects 114, such as metal balls, metal columns, stud bumps, or metal bumps, may be coupled to the component pads 108 around the peripheral region of the base package substrate 102. A molding coverlay 1502, such as an epoxy filler, an adhesive film, or the like, may be positioned in the central region of the component side 104.

Figure 16:
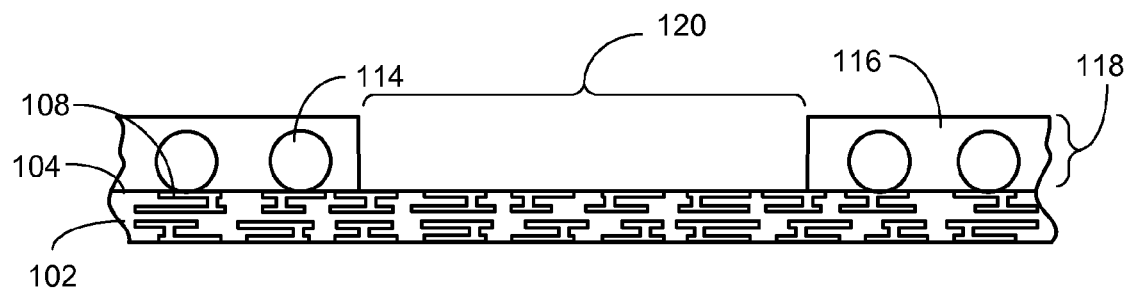
FIG. 16 is a cross-sectional view of a base package substrate assembly in a substrate molding phase of manufacturing for the eighth alternative embodiment of the present invention.

Referring now to FIG. 16, therein is shown a cross-sectional view of a base package substrate assembly 1600 in a substrate molding phase of manufacturing for the eighth alternative embodiment of the present invention. The cross-sectional view of a base package substrate assembly 1600 depicts the base package substrate 102 having the stacking interconnects 114 coupled to the component pads 108.

The reinforced encapsulant 116 may be molded on the component side 104, the stacking interconnects 114, and the component pads 108. The molding coverlay 1502, of FIG. 15 has been removed to expose the central region of the component side to provide the integrated circuit receptacle 120.

The encapsulant thickness 118 may exceed the height of the stacking interconnects 114. The additional height of the encapsulant thickness 118 may provide additional rigidity to prevent warping of the base package substrate 102.

Figure 17:
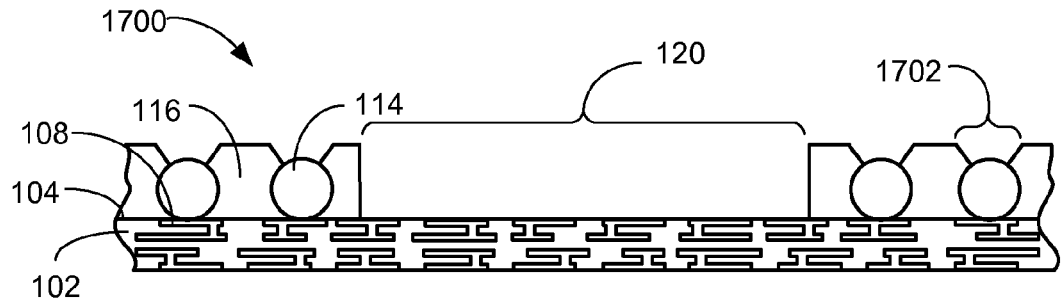
FIG. 17 is a cross-sectional view of a base package substrate assembly in an interconnect opening phase of manufacturing for the eighth alternative embodiment of the present invention.

Referring now to FIG. 17, therein is shown a cross-sectional view of a base package substrate assembly 1700 in an interconnect opening phase of manufacturing for the eighth alternative embodiment of the present invention. The cross-sectional view of the base package substrate assembly 1700 depicts the base package substrate 102 having the stacking interconnects 114 coupled to the component pads 108.

The reinforced encapsulant 116 has been molded on the component side 104, the stacking interconnects 114, and the component pads 108. The integrated circuit receptacle 120 is exposed in the central region of the component side 104.

The reinforced encapsulant 116 may completely enclose the stacking interconnects 114. In this case the stacking interconnects 114 may be exposed by laser ablation, chemical etching, or mechanical drilling for forming alignment receptacles 1702.

Figure 18:
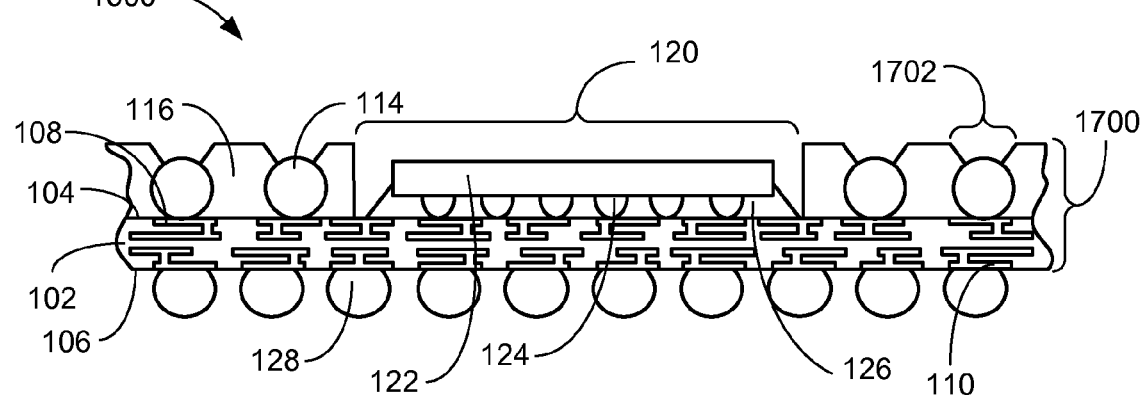
FIG. 18 is a cross-sectional view of an integrated circuit packaging assembly in a pre-singulation phase of manufacturing for the eighth alternative embodiment of the present invention.

Referring now to FIG. 18, therein is shown a cross-sectional view of an integrated circuit packaging assembly 1800 in a pre-singulation phase of manufacturing for the eighth alternative embodiment of the present invention. The cross-sectional view of the integrated circuit packaging assembly 1800 depicts the base package substrate assembly 1700 having the integrated circuit device 122, such as a wire bond type, a flip chip type of integrated circuit die, or a stacked combination thereof, may be coupled to the component pads 108 exposed in the integrated circuit receptacle 120 by the chip interconnects 124.

The adhesive 126 may be applied between the component side 104 and the integrated circuit device 122. The sidewalls of the reinforced encapsulant 116 must be formed to allow sufficient space around the integrated circuit device 122 to allow application of the adhesive 126.

The system interconnects 128 are formed on the system pads 110 located on the system side 106 of the base package substrate 102. The system interconnects 128 may provide the coupling path between the stacking interconnects 114, the integrated circuit device 122, the next level system (not shown), or a combination thereof.

The forming of the alignment receptacles 1702 may provide the access to the stacking interconnects 114 without reducing the ability of the reinforced encapsulant 116 to prevent the warping of the base package substrate 102. The alignment receptacles 1702 may also simplify the mounting of a stacked package (not shown) by providing an alignment aid for the system interconnects 128 of the stacked package.

Figure 19:
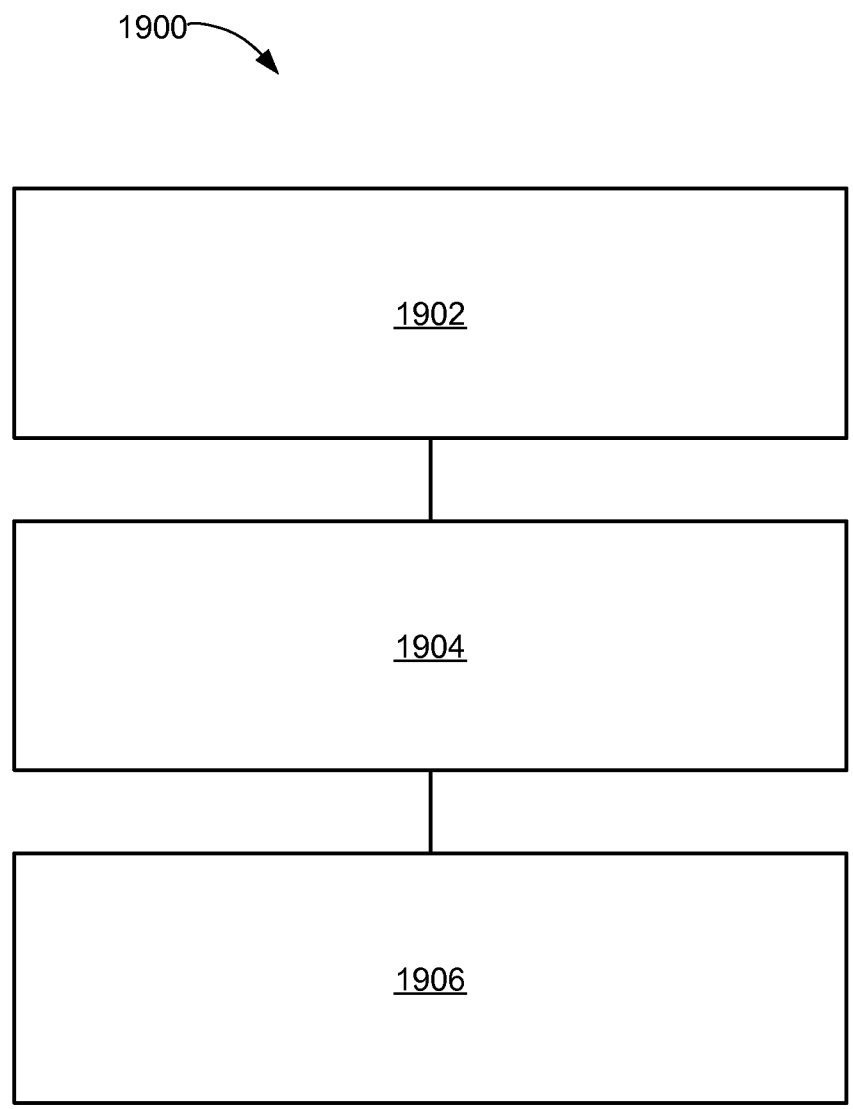
FIG. 19 is a flow chart of a method of manufacture of the integrated circuit packaging system in an embodiment of the present invention.

Referring now to FIG. 19, therein is shown a flow chart of a method 1900 of manufacture of the integrated circuit packaging system 100 in an embodiment of the present invention. The method 1900 includes: fabricating a base package substrate having a component side and a system side in a block 1902; coupling stacking interconnects on the component side in a block 1904; and forming an integrated circuit receptacle, for receiving an integrated circuit device, by molding a reinforced encapsulant on the component side and exposing a portion of the stacking interconnects in a block 1906.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   fabricating a base package substrate having a component side and a system side;
   coupling stacking interconnects on the component side; and
   molding a reinforced encapsulant on the component side for forming an integrated circuit receptacle from the reinforced encapsulant and the component side, inserting an integrated circuit device into the integrated circuit receptacle, and exposing a portion of the stacking interconnects.

2. The method as claimed in claim 1 wherein molding the reinforced encapsulant includes forming an encapsulant thickness to be in the range from 30% to 90% of the total height of the stacking interconnects.

3. The method as claimed in claim 1 wherein inserting the integrated circuit device includes mounting an integrated circuit die in the integrated circuit receptacle.

4. The method as claimed in claim 1 further comprising forming a substantially coplanar surface between the stacking interconnects and the reinforced encapsulant.

5. The method as claimed in claim 1 further comprising forming an alignment receptacle on the stacking interconnect exposed from the reinforced encapsulant.

6. A method of manufacture of an integrated circuit packaging system comprising:
   fabricating a base package substrate having a component side and a system side including forming component pads on the component side, system pads on the system side, and internal circuitry for coupling the component pads to the system pads;
   coupling stacking interconnects on the component side including mounting metal balls, metal columns, stud bumps, or metal bumps on the component pads; and
   molding a reinforced encapsulant on the component side for forming an integrated circuit receptacle from the reinforced encapsulant and the component side, inserting an integrated circuit device into the integrated circuit receptacle, and exposing a portion of the stacking interconnects including exposing the component pads in the integrated circuit receptacle.

7. The method as claimed in claim 6 wherein molding the reinforced encapsulant includes forming an encapsulant thickness to be in the range from 30% to 90% of the total height of the stacking interconnects for preventing a warping of the base package substrate.

8. The method as claimed in claim 6 wherein inserting the integrated circuit device includes mounting an integrated circuit die in the integrated circuit receptacle by coupling a chip interconnect between the integrated circuit die and the component pads.

9. The method as claimed in claim 6 further comprising forming a substantially coplanar surface between the stacking interconnects and the reinforced encapsulant including coining, hammering, compressing, or shaving the stacking interconnects.

10. The method as claimed in claim 6 further comprising forming an alignment receptacle on the stacking interconnect exposed from the reinforced encapsulant wherein forming the alignment receptacle includes exposing the stacking interconnects by laser ablation, chemical etching, or mechanical drilling of the reinforced encapsulant.

11. An integrated circuit packaging system comprising:
    a base package substrate having a component side and a system side;
    stacking interconnects on the component side; and
    a reinforced encapsulant molded on the component side having an integrated circuit receptacle formed from the reinforced encapsulant and the component side, for inserting an integrated circuit device into the integrated circuit receptacle, and with a portion of the stacking interconnects exposed.

12. The system as claimed in claim 11 wherein the reinforced encapsulant molded on the component side includes an encapsulant thickness in the range from 30% to 90% of the total height of the stacking interconnects.

13. The system as claimed in claim 11 further comprising an integrated circuit die mounted in the integrated circuit receptacle.

14. The system as claimed in claim 11 further comprising a substantially coplanar surface formed by the stacking interconnects and the reinforced encapsulant.

15. The system as claimed in claim 11 further comprising an alignment receptacle formed on the stacking interconnect exposed from the reinforced encapsulant.

16. The system as claimed in claim 11 further comprising:
    component pads on the component side, system pads on the system side, and internal circuitry coupled between the component pads and the system pads;
    metal balls, metal columns, stud bumps, or metal bumps on the component pads form the stacking interconnects; and
    the component pads exposed in the integrated circuit receptacle.

17. The system as claimed in claim 16 wherein the reinforced encapsulant molded on the component side includes an encapsulant thickness to be in the range from 30% to 90% of the total height of the stacking interconnects for preventing a warping of the base package substrate.

18. The system as claimed in claim 16 further comprising an integrated circuit die mounted in the integrated circuit receptacle by a chip interconnect coupled between the integrated circuit die and the component pads.

19. The system as claimed in claim 16 further comprising a substantially coplanar surface formed by the stacking interconnects and the reinforced encapsulant includes the stacking interconnects coined, hammered, compressed, or shaved.

20. The system as claimed in claim 16 further comprising an alignment receptacle formed on the stacking interconnect exposed from the reinforced encapsulant includes the reinforced encapsulant laser ablated, chemically etched, or mechanically drilled with the stacking interconnect exposed.

* * * * *